(12) United States Patent
Kurita

(10) Patent No.: US 10,847,497 B2
(45) Date of Patent: Nov. 24, 2020

(54) BONDING METHOD OF SEMICONDUCTOR CHIP AND BONDING APPARATUS OF SEMICONDUCTOR CHIP

(71) Applicant: KABUSHIKI KAISHA TOSHIBA, Tokyo (JP)

(72) Inventor: Yoichiro Kurita, Tokyo (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 0 days.

(21) Appl. No.: 15/643,623

(22) Filed: Jul. 7, 2017

(65) Prior Publication Data

US 2017/0309594 A1 Oct. 26, 2017

Related U.S. Application Data

(63) Continuation of application No. 14/710,070, filed on May 12, 2015, now Pat. No. 9,728,519.

(30) Foreign Application Priority Data

Oct. 30, 2014 (JP) .................................. 2014-221907

(51) Int. Cl.
*H01L 23/00* (2006.01)
*H01L 21/67* (2006.01)
*H01L 21/02* (2006.01)

(52) U.S. Cl.
CPC ........ *H01L 24/97* (2013.01); *H01L 21/67132* (2013.01); *H01L 24/75* (2013.01);
(Continued)

(58) Field of Classification Search
None
See application file for complete search history.

(56) References Cited

U.S. PATENT DOCUMENTS 6,589,809 B1 * 7/2003 Koopmans ........ H01L 21/67121
438/113
6,913,985 B2 7/2005 Ogihara et al.
(Continued)

FOREIGN PATENT DOCUMENTS

JP 4724271 A 10/1972
JP 4724271 U 11/1972
(Continued)

*Primary Examiner* — Steven M Christopher
(74) *Attorney, Agent, or Firm* — Holtz, Holtz & Volek PC

(57) ABSTRACT

A mounting apparatus of a chip including a mechanism configured to arrange a front surface of a chip and a front surface of a substrate to face each other such that a back surface of the chip is attached to a sheet, the sheet having a first portion corresponding to the selected chip and a the second portion arranged at a periphery of the first portion corresponding to the selected chip in the sheet when seen in a direction perpendicular to the front surface of the substrate; a holding mechanism moving in a direction that is not perpendicular to the front surface of the substrate and arranged to hold the second portion of the sheet; and a pushing mechanism for pushing the back surface of the chip through the first portion of the sheet so that the front surface of the chip is brought close to the front surface of the substrate with the first portion deformed in a state where the second portion is held by the holding mechanism, and configured to release the pushing mechanism from the first portion of the sheet to strip the sheet from the back surface of the chip.

20 Claims, 7 Drawing Sheets

(52) U.S. Cl.
CPC ........ *H01L 24/83* (2013.01); *H01L 21/02076* (2013.01); *H01L 2224/753* (2013.01); *H01L 2224/756* (2013.01); *H01L 2224/759* (2013.01); *H01L 2224/7525* (2013.01); *H01L 2224/7555* (2013.01); *H01L 2224/75743* (2013.01); *H01L 2224/832* (2013.01); *H01L 2224/838* (2013.01); *H01L 2224/83104* (2013.01); *H01L 2224/97* (2013.01); *H01L 2924/05442* (2013.01); *H01L 2924/1032* (2013.01); *H01L 2924/10253* (2013.01)

(56) References Cited

U.S. PATENT DOCUMENTS

| | | | |
|---|---|---|---|
| 8,324,079 | B2 | 12/2012 | Takahashi et al. |
| 8,610,152 | B2 | 12/2013 | Takahashi et al. |
| 2007/0020800 | A1 | 1/2007 | Ishikawa et al. |
| 2007/0037323 | A1 | 2/2007 | Henley et al. |
| 2008/0210368 | A1* | 9/2008 | Zakel ................ H01L 21/67132 156/230 |
| 2009/0183766 | A1 | 7/2009 | Takahashi et al. |
| 2013/0087876 | A1 | 4/2013 | Takahashi et al. |
| 2014/0141560 | A1 | 5/2014 | Maekawa et al. |
| 2015/0101758 | A1* | 4/2015 | Honda ................ B32B 38/10 156/714 |
| 2015/0311104 | A1 | 10/2015 | Xu |
| 2016/0276195 | A1* | 9/2016 | Huska ................ H01L 21/681 |

FOREIGN PATENT DOCUMENTS

| | | |
|---|---|---|
| JP | 555229 A | 4/1980 |
| JP | 5552229 A | 4/1980 |
| JP | 06188290 A | 7/1994 |
| JP | 11067697 A | 3/1999 |
| JP | 11330620 A | 11/1999 |
| JP | 2007027549 A | 2/2007 |
| JP | 2008535275 A | 8/2008 |
| JP | 2009200477 A | 9/2009 |
| JP | 2010087035 A | 4/2010 |
| JP | 2012156473 A | 8/2012 |
| JP | 2013243333 A | 12/2013 |
| JP | 2013251405 A | 12/2013 |
| JP | 2014033100 A | 2/2014 |
| JP | 2014103291 A | 6/2014 |
| WO | 2006105782 A3 | 10/2006 |
| WO | 2012133760 A1 | 10/2012 |

* cited by examiner

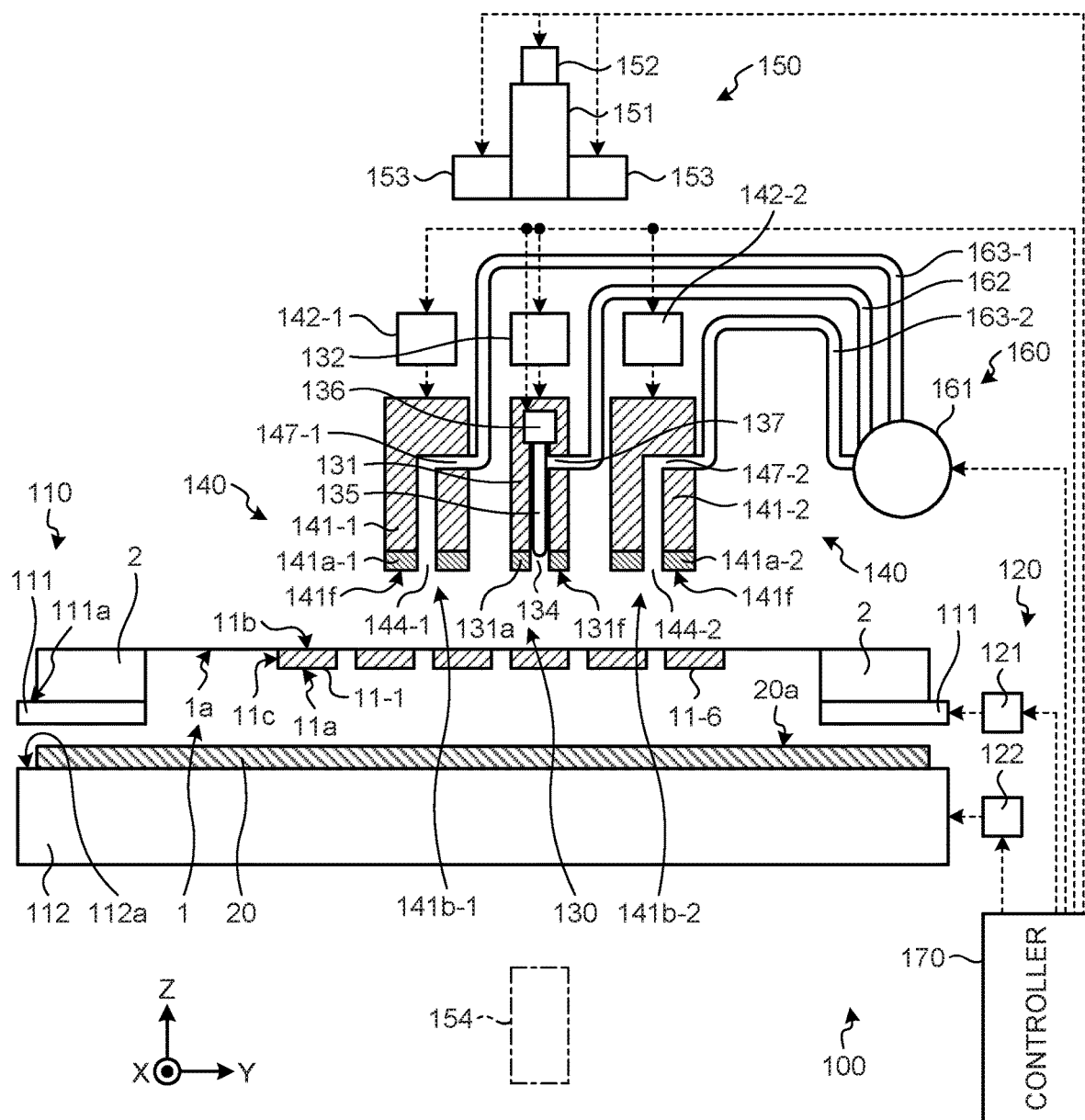

US 10,847,497 B2

BONDING METHOD OF SEMICONDUCTOR CHIP AND BONDING APPARATUS OF SEMICONDUCTOR CHIP

CROSS-REFERENCE TO RELATED APPLICATIONS

This application is a Continuation Application of U.S. Ser. No. 14/710,070, filed May 12, 2015, which is based upon and claims the benefit of priority from Japanese Patent Application No. 2014-221907, filed on Oct. 30, 2014, the entire contents of both of which are incorporated herein by reference.

FIELD

Embodiments described herein relate generally to a bonding method of a semiconductor chip and a bonding apparatus of the semiconductor chip.

BACKGROUND

A semiconductor chip is mounted and bonded on a substrate to obtain a semiconductor device. In this case, the semiconductor chip is desirably mounted on the substrate while suppressing thermal deformation of the semiconductor chip and suppressing position shift in the bonding that occurs from the difference in the coefficients of thermal expansion of the semiconductor chip and the substrate.

BRIEF DESCRIPTION OF THE DRAWINGS

FIG. 2A is a cross-sectional view illustrating a configuration of a bonding apparatus of the semiconductor chip according to the embodiment;

FIG. 2B is a bottom view of a pushing head in the bonding apparatus according to the embodiment;

DETAILED DESCRIPTION

Figure 1A:
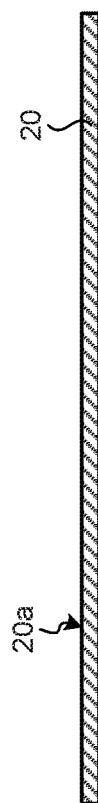
FIGS. 1A to 1G are cross-sectional views illustrating a bonding method of a semiconductor chip according to an embodiment.

In general, according to one embodiment, there is provided a bonding method of a semiconductor chip. The bonding method includes arranging an activated front surface of a semiconductor chip and an activated front surface of a substrate so as to face each other with a back surface of the semiconductor chip attached to a sheet. The bonding method includes pushing the back surface of the semiconductor chip through the sheet to closely attach the activated front surface of the semiconductor chip and the activated front surface of the substrate. The bonding method includes stripping the sheet from the back surface of the semiconductor chip while maintaining the state in which the activated front surface of the semiconductor chip is closely attached to the activated front surface of the substrate.

Exemplary embodiments of a bonding method of a semiconductor chip will be explained below in detail with reference to the accompanying drawings. The present invention is not limited to the following embodiments.

Embodiment

A bonding method of a semiconductor chip according to an embodiment will be described. The bonding method of the semiconductor chip is a method for mounting a semiconductor chip on a substrate.

For example, a plurality of chips needs to be stacked in a packaging step of a device to obtain a stacked type device. In this case, if chips of different chip sizes coexist in a plurality of chips to be stacked, it is difficult to first bond two substrates and then collectively singulate the substrates to obtain the stacked type device. Thus, one substrate (semiconductor substrate) of the two substrates first needs to be singulated to a plurality of semiconductor chips, and then the semiconductor chips need to be mounted on the other substrate.

Alternatively, an optical element needs to be stacked on a template substrate to obtain an optical device. In this case, if substrate sizes of a substrate for the optical element to be singulated to a plurality of optical elements and a substrate for the template substrate to be singulated to a plurality of template substrates are different, a useless region that does not contribute to obtaining the optical device forms when the two substrates are bonded. Thus, one substrate (semiconductor substrate) for the optical element of the two substrates needs to be first singulated to a plurality of semiconductor chips, and then the chips need to be mounted on the other substrate.

Consider a case of interposing a solder bump between a pad electrode of the semiconductor chip and a pad electrode of the substrate for conduction.

In this case, the semiconductor chip and the substrate need to be heated to a high temperature (e.g., 350 to 400° C.) to solder bond the solder bump to each of the pad electrode of the semiconductor chip and the pad electrode of the substrate, and hence there is a possibility the semiconductor chip and the substrate may thermally deform. If the semiconductor chip and the substrate are made from materials of different coefficients of thermal expansion, the alignment accuracy in the bonding of the pad electrode of the semiconductor chip and the pad electrode of the substrate may lower and the electrodes may not be conducted if the semiconductor chip and the substrate are thermally deformed.

In the present embodiment, as illustrated in FIG. 1 to FIG. 5, the semiconductor chip is mounted at a normal temperature on the substrate by plasma activated bonding of the semiconductor chip to the substrate. In other words, the semiconductor chip is temporarily bonded at a normal temperature on the substrate by activating the front surface of the semiconductor chip and the front surface of the substrate by plasma and closely attaching the semiconductor chip to the substrate. Thereafter, the semiconductor chip is heated and pressurized to be actually bonded to the substrate. The bonding position of the semiconductor chip on the substrate can be substantially fixed with the temporary bonding, and hence the alignment accuracy in the bonding of the semiconductor chip can be easily enhanced in the actual bonding.

It should be noted that, if electrical conduction is required between the semiconductor chip and the substrate as in the bonding of the semiconductor chip and the substrate using the solder bump described above, a conductor electrode may be arranged on a part of the respective front surface of the semiconductor chip and the substrate to be activated, and the conductors may be electrically connected apart from the bonding by the plasma activation. For example, a solder electrode surrounded by an insulating film (silicon dioxide film) is prepared on the front surface in each of the semiconductor chip and the substrate. The insulating films in each of the semiconductor chip and the substrate may be bonded and then heated to melt the solder electrodes thus bonding the solder electrodes.

FIGS. 1A to 1G, FIGS. 3A to 3C, and FIGS. 4A to 4C are step cross-sectional views illustrating a bonding method of the semiconductor chip. FIG. 2A is a cross-sectional view illustrating a configuration of a bonding apparatus of the semiconductor chip. FIG. 2B is a bottom view of a pushing head in the bonding apparatus.

It should be noted that, the activation in the plasma activated bonding refers to terminating the front surface of the semiconductor chip and the front surface of the substrate with a hydroxyl group to realize a state in which water molecules can be easily bonded. The plasma activated bonding is also sometimes referred to as oxide bonding, fusion bonding, spontaneous bonding, or the like.

Figure 1B:
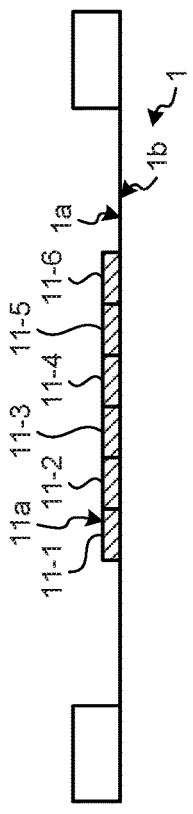
Figure 1C:
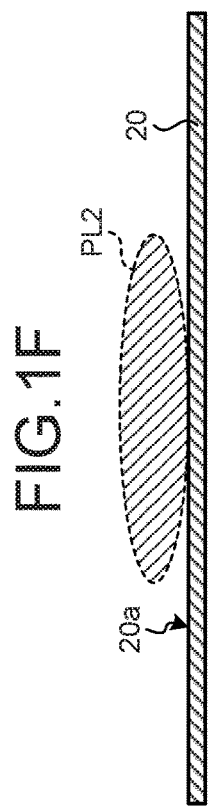
Figure 1D:
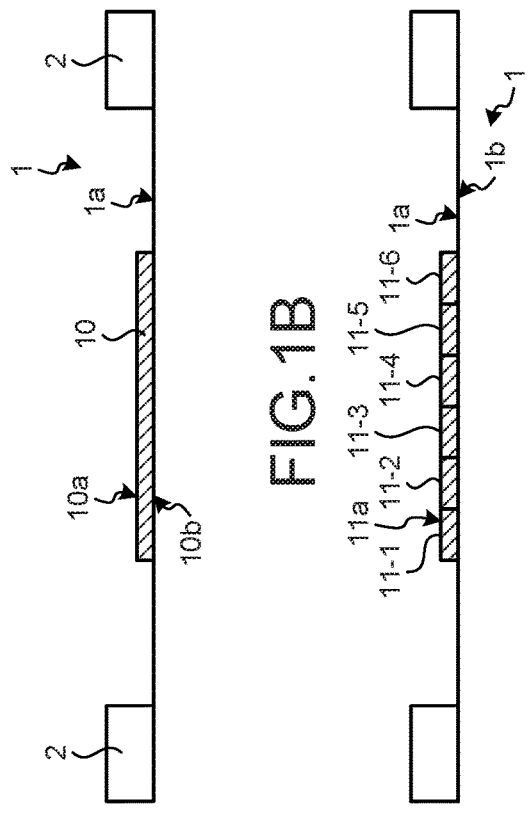
Figure 1E:
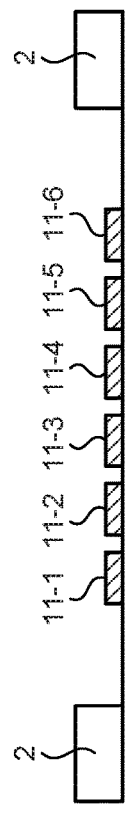
Figure 1F:
Figure 1G:
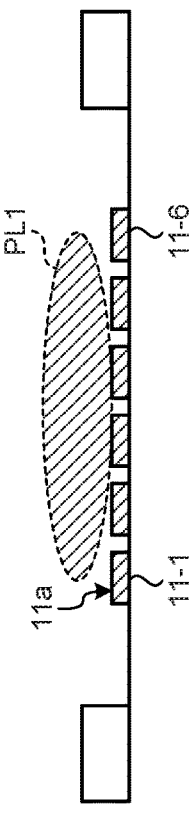

In the bonding method of the semiconductor chip, the steps illustrated in FIGS. 1A to 1D and the steps illustrated in FIGS. 1E to 1G are carried out in parallel as a pre-process of the temporary bonding in the plasma activated bonding.

In the step illustrated in FIG. 1A, a semiconductor substrate 10 to be singulated to a plurality of semiconductor chips 11-1 to 11-6 (see FIG. 1B) is prepared. A portion (excluding a pad electrode) in the vicinity of a front surface 10a in the semiconductor substrate 10 is made of a material having any one of silicon, silicon oxide, III-V group semiconductor, and an oxide of the III-V group semiconductor as a main component. If the portion in the vicinity of the front surface 10a in the semiconductor substrate 10 is made of a material having the silicon oxide as the main component, a region deeper than the portion in the vicinity of the front surface 10a in the semiconductor substrate 10 may be made of a material having the silicon as the main component or a material having the III-V group semiconductor as the main component. If the portion in the vicinity of the front surface 10a in the semiconductor substrate 10 is made of a material having the oxide of the III-V group semiconductor as the main component, the region deeper than the portion in the vicinity of the front surface 10a in the semiconductor substrate 10 may be made of a material having the III-V group semiconductor as the main component. The III-V group semiconductor includes, for example, InP, GaAs, and GaN.

The front surface 10a in the semiconductor substrate 10 can have planarity of smaller than or equal to 1 nm, and more preferably, smaller than or equal to 0.3 nm. If the planarity of the front surface 10a is smaller than or equal to 0.3 nm, the planarity of a front surface 11a of each singulated semiconductor chip 11 also becomes smaller than or equal to 0.3 nm. If the planarity of the front surface 11a of each semiconductor chip 11 is smaller than or equal to 0.3 nm, a void (air gap) forms at a bonding interface when the semiconductor chip 11 is temporarily bonded to the substrate 20 in the step (step illustrated in FIG. 5D) of the actual bonding, and the bonding strength of the actual bonding can be suppressed from not meeting the required strength.

For example, the planarity of the front surface 10a can be made to smaller than or equal to 1 nm or can be made to smaller than or equal to 0.3 nm by polishing the front surface 10a of the semiconductor substrate 10 through the CMP method, and the like.

Next, a back surface 10b of the prepared semiconductor substrate 10 is attached to a front surface 1a of an adhesive sheet (dicing tape) 1. In other words, the semiconductor substrate 10 is attached to the adhesive sheet 1 with the front surface 10a exposed (face-up state). The adhesive sheet 1 has an adhesive applied on the front surface 1a. The adhesive may be an adhesive having UV curability, for example. The adhesive sheet 1 is stretched within a frame of an annular flat ring 2 and fixed to the flat ring 2. The adhesive sheet 1 is formed, for example, with a transparent resin having light permeability.

In the step illustrated in FIG. 1B, the semiconductor substrate 10 is divided to be singulated into the plurality of semiconductor chips 11-1 to 11-6. For example, the semiconductor substrate 10 is dicing processed along a dicing line. The dicing processing may be carried out by cutting with a dicing blade along the dicing line. In this case, the cutting may be carried out with the dicing blade while introducing water jet, formed by thinly injecting water, to a cutting area. Cutting scraps (particles) thus can be prevented from attaching to the front surface 11a of the semiconductor chip 11. Alternatively, the dicing processing may be carried out by emitting a laser along the dicing line and performing laser processing.

Thereafter, UV irradiation may be carried out on the adhesive sheet 1 from the back surface 1b side to cure the adhesive applied on the front surface 1a of the adhesive sheet 1, thus lowering the adhesion force thereof.

Furthermore, washing (e.g., ultrasonic washing) and drying processes are sequentially carried out on the front surface 11a of each semiconductor chip 11 with each semiconductor chip 11 attached to the adhesive sheet 1. If the particles are attached to the front surface 11a of each semiconductor chip 11, the attached particles thus can be removed.

In the step illustrated in FIG. 1C, an interval of the plurality of semiconductor chips 11-1 to 11-6 on the adhesive sheet 1 is widened.

For example, the adhesive sheet 1 is once detached from the flat ring 2, and then the adhesive sheet 1 is pulled to spread toward the periphery with the plurality of semiconductor chips 11-1 to 11-6 attached thereto. The interval of the adjacent semiconductor chips 11-1 to 11-6 thus can be widened.

At this time, as illustrated in FIG. 1C, the interval of the adjacent semiconductor chips 11-1 to 11-6 can be widened to greater than the thickness of each semiconductor chip 11. If the interval of the adjacent semiconductor chips 11-1 to 11-6 is smaller than or equal to the thickness of each semiconductor chip 11, a side surface 11c of the semiconductor chip 11 to be pushed makes contact with a side surface 11c of the adjacent semiconductor chip 11 and may possibly produce particles in the step (step illustrated in FIG. 5A) of pushing the semiconductor chip 11 through the adhesive sheet 1. If the produced particles are attached to the surface to be temporarily bonded, a void (air gap) having the particle as the starting point forms at the bonding interface when the semiconductor chip 11 is temporarily bonded to the substrate 20, and the bonding strength of the temporary bonding may not meet the required strength. For example, if a particle having a diameter of 1 μm is interposed at the bonding surface, there is a possibility a void having a width in the direction along the bonding interface of about 1000 μm may form.

In the step illustrated in FIG. 1D, the front surfaces 11a of the plurality of semiconductor chips 11-1 to 11-6 are collectively activated. For example, the flat ring 2, to which the adhesive sheet 1 attached with the plurality of semiconductor chips 11-1 to 11-6 are fixed, is mounted on a stage in a processing chamber of a plasma processing device (not illustrated). In this case, the front surface 11a of each semiconductor chip 11 is facing the upper side. When plasma PL1 is irradiated onto the front surfaces 11a of the plurality of semiconductor chips 11-1 to 11-6 under depressurization, the front surface 11a of each semiconductor chip 11-1 to 11-6 is activated. Thereafter, the flat ring 2, to which the adhesive sheet 1 attached with the plurality of semiconductor chips 11-1 to 11-6 are fixed, is conveyed out to the exterior of the processing chamber.

Contaminated objects such as organic substances, and the like attached to the front surface 11a of each semiconductor chip 11 thus can be removed, and the front surface 11a can be terminated with the hydroxyl group. For example, a portion (excluding the pad electrode) in the vicinity of the front surface 11a of each semiconductor chip 11 is made from a material having any one of the silicon, the silicon oxide, the III-V group semiconductor, and the oxide of III-V group semiconductor as the main component. In any case, the front surface 11a can be activated and the front surface 11a can be terminated with the hydroxyl group according to the step illustrated in FIG. 1C.

It should be noted that, the front surface 11a of each semiconductor chip 11 may be activated by irradiating the front surface 11a of each semiconductor chip 11 with an energy beam (bombardment) of atoms such as Ar, and the like or ions, instead of irradiating the front surface 11a of each semiconductor chip 11 with the plasma.

In the meantime, in the step illustrated in FIG. 1E, a substrate 20 on which the semiconductor chip 11 is to be mounted is prepared. The substrate 20, for example, includes a semiconductor substrate or a glass substrate. If the substrate 20 is the semiconductor substrate, a portion (excluding the pad electrode) in the vicinity of a front surface 20a of the substrate 20 is made of a material having any one of the silicon, the silicon oxide, the III-V group semiconductor, and the oxide of the III-V group semiconductor as the main component. If the portion in the vicinity of the front surface 20a in the substrate 20 is made of a material having the silicon oxide as the main component, a region deeper than the portion in the vicinity of the front surface 20a in the substrate 20 may be made of a material having the silicon as the main component or a material having the III-V group semiconductor as the main component. If the portion in the vicinity of the front surface 10a in the semiconductor substrate 10 is made of a material having the oxide of the III-V group semiconductor as the main component, a region deeper than the portion in the vicinity of the front surface 10a in the semiconductor substrate 10 may be made of a material having the III-V group semiconductor as the main component. The III-V group semiconductor includes, for example, InP, GaAs, and GaN. If the substrate 20 is the glass substrate, a portion (excluding the pad electrode) in the vicinity of the front surface 20a in the substrate 20 is made of a material having the silicon oxide or a sapphire as the main component, for example.

The front surface 20a in the substrate 20 can have planarity of smaller than or equal to 1 nm, and more preferably, smaller than or equal to 0.3 nm. If the planarity of the front surface 20a is smaller than or equal to 0.3 n, a void (air gap) forms at a bonding interface when the semiconductor chip 11 is temporarily bonded to the substrate 20 in the step (step illustrated in FIG. 5D) of the actual bonding, and the bonding strength of the actual bonding can be suppressed from not meeting the required strength.

For example, the planarity of the front surface 20a of the substrate 20 can be made to smaller than or equal to 1 nm or can be made to smaller than or equal to 0.3 nm by polishing the front surface 20a of the substrate 20 through the CMP method, and the like.

Furthermore, the washing (e.g., ultrasonic washing) and drying processes are sequentially carried out on the front surface 20a of the prepared substrate 20. If particles are attached to the front surface 20a of the substrate 20, the attached particles thus can be removed.

In the step illustrated in FIG. 1F, the front surface 20a of the substrate 20 is activated. For example, the substrate 20 is mounted on a stage in a processing chamber of a plasma processing device (not illustrated) such that the front surface 20a is facing the upper side. When plasma PL2 is irradiated onto the front surface 20a of the substrate 20 under depressurization, the front surface 20a of the substrate 20 is activated. Thereafter, the substrate 20 is conveyed out to the exterior of the processing chamber.

Contaminated objects such as organic substances, and the like attached to the front surface 20a of the substrate 20 thus can be removed, and the front surface 20a can be terminated with the hydroxyl group. The portion (excluding the pad electrode) in the vicinity of the front surface 20a of the substrate 20 is made of a material having any one of the silicon, the silicon oxide, the III-V group semiconductor, and the oxide of III-V group semiconductor as the main component. In any case, the front surface 20a can be activated and the front surface 20a can be terminated with the hydroxyl group according to the step illustrated in FIG. 1F.

Furthermore, the washing (e.g., ultrasonic washing) and drying processes are sequentially carried out on the front surface 20a of the substrate 20 in the step illustrated in FIG. 1G. If the particles are attached to the front surface 20a of the substrate 20, the attached particles thus can be removed.

In the bonding method of the semiconductor chip, the temporary bonding in the plasma activated bonding is carried out.

When temporarily bonding the semiconductor chip 11 to the substrate 20, assume a case of picking up each semiconductor chip 11 and detaching from the adhesive sheet 1, and mounting each semiconductor chip 11 on the substrate 20. In this case, a part of the semiconductor chip 11 may chip and produce particles when the front surface 11a or the side surface 11c of the semiconductor chip 11 is touched, and such produced particles may attach to the front surface 11a of the semiconductor chip 11. If the produced particles are attached to the front surface 11a, a void (air gap) having the particle as the starting point may form at the bonding interface when the semiconductor chip 11 is temporarily bonded to the substrate 20, and the bonding strength of the temporary bonding may not meet the required strength. For example, if the particle having a diameter of 1 μm is interposed at the bonding interface, there is a possibility a void having a width in the direction along the bonding interface of about 1000 μm may form.

In the present embodiment, a devisal is made to handle the semiconductor chip 11 without touching the activated front surface 11a of the semiconductor chip 11 when temporarily bonding the semiconductor chip 11 to the substrate 20. In other words, the activated front surface 11a of the semiconductor chip 11 attached to the adhesive sheet 1 and the activated front surface 20a of the substrate 20 are arranged to face each other, and the back surface 11b of the semiconductor chip 11 is pushed through the adhesive sheet 1 to temporarily bond the semiconductor chip 11 to the substrate 20, so that the temporary bonding is carried out while suppressing the production of particles.

Specifically, the temporary bonding of the plasma activated bonding is carried out using a bonding apparatus 100 illustrated in FIGS. 2A and 2B.

As illustrated in FIG. 2A, the bonding apparatus 100 includes an arrangement mechanism 110, an alignment mechanism 120, a pushing mechanism 130, a holding mechanism 140, a recognition mechanism 150, a depressurization mechanism 160, and a controller 170. In FIGS. 2A and 2B, a direction perpendicular to an upper surface 112a of a substrate stage 112 is a Z direction, and two directions orthogonal to each other within a plane parallel to the upper surface 112a is an X direction and a Y direction.

The controller 170 entirely controls each unit of the bonding apparatus 100.

The arrangement mechanism 110 arranges the activated front surface 11a of each semiconductor chip 11 and the activated front surface 20a of the substrate 20 so as to face each other with the back surface 11b of each semiconductor chip 11 attached to the front surface 1a of the adhesive sheet 1. For example, the arrangement mechanism 110 includes a sheet stage 111 and the substrate stage 112.

The sheet stage 111 has a substantially ring shape when seen from the Z direction in correspondence with the flat ring 2. The flat ring 2 is mounted on an upper surface 111a of the sheet stage 111 with the front surface 11a of each semiconductor chip 11 facing the lower side. The sheet stage 111 may suction and hold the flat ring 2 by vacuum adsorption or electrostatic adsorption.

The substrate stage 112 has a planar shape including the substrate 20 on the inner side when seen from the Z direction in correspondence with the substrate 20. The substrate 20 is mounted on the upper surface 112a of the substrate stage 112 with the front surface 20a facing the upper side. The substrate stage 112 may suction and hold the substrate 20 by vacuum adsorption or electrostatic adsorption.

The alignment mechanism 120 aligns the relative positions of the semiconductor chip 11 and the substrate 20 under the control by the controller 170. For example, the alignment mechanism 120 includes drive mechanisms 121, 122. The drive mechanism 121 drives the sheet stage 111 in the X direction, the Y direction, and a θ direction in accordance with a command of a drive amount received from the controller 170. The θ direction is a rotating direction about the Z axis. The drive mechanism 122 drives the substrate stage 112 in the X direction, the Y direction, and the θ direction in accordance with the command of the drive amount received from the controller 170.

It should be noted that, the alignment mechanism 120 may have a configuration in which one of the drive mechanism 121 or the drive mechanism 122 is omitted as long as the relative positions of the semiconductor chip 11 and the substrate 20 can be aligned.

The depressurization mechanism 160 includes a vacuum pump 161 and vacuum exhaust paths 162, 163-1, 163-2.

Figure 5A:
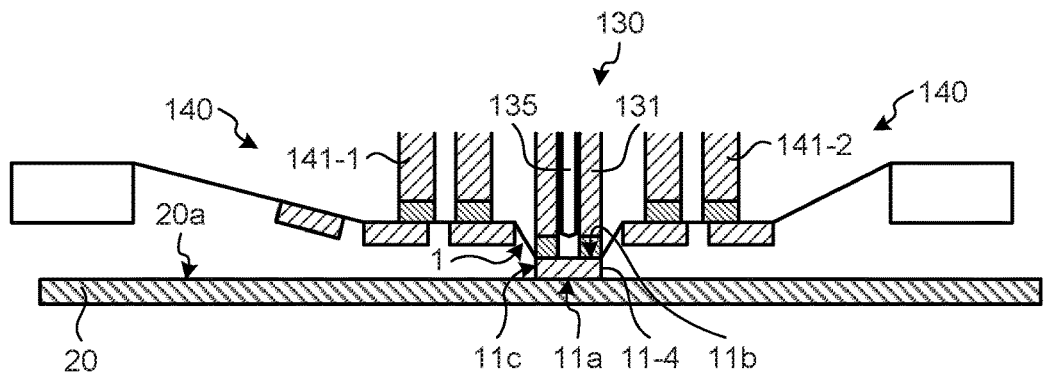
FIGS. 5A to 5D are cross-sectional views illustrating the bonding method of the semiconductor chip according to the embodiment.

The pushing mechanism 130 pushes the back surface 11b of the semiconductor chip 11 through the adhesive sheet 1 to closely attach the activated front surface 11a of the semiconductor chip 11 and the activated front surface 20a of the substrate 20 under the control by the controller 170 (see FIG. 5A). The semiconductor chip 11 is thereby temporarily bonded to the substrate 20. The pushing mechanism 130 also strips the adhesive sheet 1 from the back surface 11b of the semiconductor chip 11 while maintaining the state in which the activated front surface 11a of the semiconductor chip 11 is closely attached to the activated front surface 20a of the substrate 20 (see FIGS. 5B and 5C). For example, the pushing mechanism 130 includes a pushing head 131, a head drive unit 132, a pin 135, and a pin drive unit 136.

The pushing head 131 has a pushing surface 131f corresponding to the back surface 11b of the semiconductor chip 11. The pushing surface 131f has a planar shape that does not interfere with the adjacent semiconductor chip 11 including the back surface 11b of the semiconductor chip 11 to be pushed when seen from the Z direction. The pushing surface 131f may, for example, have a planar shape that is even with the back surface 11b of the semiconductor chip 11. The head drive unit 132 drives the pushing head 131 in the Z direction under the control by the controller 170. The pushing head 131 thus can push the back surface 11b of the semiconductor chip 11 through the adhesive sheet 1.

The pushing head 131 has a buffer member 131a on the pushing surface 131f. The buffer member 131a buffers a force exerted on the back surface 11b of the semiconductor chip 11 when the pushing head 131 pushes the back surface 11b of the semiconductor chip 11 through the adhesive sheet 1, and at the same time, enables a uniform pressure to be exerted on the activated surface by absorbing the shift in planarity of the chip surface and the substrate surface. The buffer member 131a can be formed, for example, with an elastic body such as a rubber, and the like.

The pushing head 131 has an suctioning structure 131b for suctioning the adhesive sheet 1 when the pushing head 131 pushes the back surface 11b of the semiconductor chip 11 through the adhesive sheet 1. As illustrated in FIG. 2B, the suctioning structure 131b is formed from a gap of a hole 134 and the pin 135, and a communication path 137. The gap of the hole 134 and the pin 135 is communicated to the vacuum exhaust path 162 through the communication path 137, and can be vacuum exhausted by the vacuum pump 161 through the vacuum exhaust path 162. Thus, the suctioning structure 131b can vacuum-suction the adhesive sheet 1. The suctioning structure 131b may be in other modes as long as the adhesive sheet 1 can be suctioned to the pushing surface 131f of the pushing head 131. For example, the suctioning structure 131b may be formed by a hole communicated from the pushing surface 131f to the communication path 137 separate from the hole, to which the pin 135 is inserted, and the communication path 137.

The pin 135 can be changed between a state of being retracted toward the pushing head 131 side than the pushing surface 131f and a state of being projected out from the pushing surface 131f. The pin 135 is movable in the Z direction within the hole 134. The hole 134 is extended in the Z direction in the pushing head 131. The pin drive unit 136 moves the pin 135 in the Z direction along the hole 134 under the control by the controller 170. The pin 135 is thereby retracted toward the pushing head side 131 than the pushing surface 131f or projected out from the pushing surface 131f.

The holding mechanism 140 is arranged at a periphery of the pushing mechanism 130. The holding mechanism 140 holds the region at the periphery of the region to be pushed with the pushing mechanism 130 in the adhesive sheet 1. The holding mechanism 140 vacuum-suctions the region at the periphery of the region to be pushed with the pushing mechanism 130 in the adhesive sheet 1. For example, the holding mechanism 140 includes a plurality of sets of configurations for holding. The plurality of sets of configuration are arranged at positions rotation symmetric with each other with respect to the pushing mechanism 130 when seen from the Z direction. Each of the plurality of sets of configurations includes holding heads 141-1, 141-2, and head drive units 142-1, 142-2.

The head drive units 142-1, 142-2 drive the holding heads 141-1, 141-2 in the Z direction under the control by the controller 170. The holding heads 141-1, 141-2 thus can vacuum-suction the adhesive sheet 1.

Each holding head 141-1, 141-2 includes a buffer member 141a-1, 141a-2 at the surface 141f that makes contact with the adhesive sheet 1. The buffer members 141a-1, 141a-2 buffer the force exerted on the back surface 11b of the semiconductor chip 11 when each holding head 141-1, 141-2 vacuum-suctions the adhesive sheet 1. The buffer members 141a-1, 141a-2 can be formed with an elastic body such as rubber, for example.

Each holding head 141-1, 141-2 includes a suctioning structure 141b-1, 141b-2 for suctioning the adhesive sheet 1. The suctioning structure 141b-1, 141b-2 is formed by a hole 144-1, 144-2 and a communication path 147-1, 147-2. The hole 144-1, 144-2 is communicated to the vacuum exhaust path 163-1, 163-2 by way of the communication path 147-1, 147-2, and can be vacuum exhausted by the vacuum pump 161 through the vacuum exhaust path 163-1, 163-2. The suctioning structures 141b-1, 141b-2 thus can vacuum-suction the adhesive sheet 1.

The recognition mechanism 150 recognizes the semiconductor chip 11 and the substrate 20. For example, the recognition mechanism 150 recognizes each of the position of the semiconductor chip 11 and the position on the substrate 20 where the semiconductor chip 11 is to be mounted. The recognition mechanism 150 includes, for example, a lens barrel 151, a camera 152, and a ring illumination 153. The recognition mechanism 150 illuminates an object (e.g., semiconductor chip 11 and substrate 20) with the ring illumination 153, and receives the reflected light with the camera 152 through the lens barrel 151. The recognition mechanism 150 thus can image the semiconductor chip 11 and the substrate 20, and provide the image obtained by imaging to the controller 170.

For example, the recognition mechanism 150 can recognize the respective positions of the semiconductor chip 11 and the substrate 20 by recognizing the respective contours of the semiconductor chip 11 and the substrate 20. Alternatively, for example, if an alignment mark is formed on each of the semiconductor chip 11 and the substrate 20, the recognition mechanism 150 can recognize the respective positions of the semiconductor chip 11 and the substrate 20 by recognizing the respective alignment marks of the semiconductor chip 11 and the substrate 20.

It should be noted that, the recognition mechanism 150 may include a coaxial illumination in place of the ring illumination 153. The coaxial illumination is, for example, arranged in the lens barrel 151 such that the optical axis is coaxial with the optical axis of the camera 152. Alternatively, the recognition mechanism 150 may include an illumination arranged on a lower side (e.g., upper surface 112a of the substrate 112) in place of the ring illumination 153. For example, if the substrate 20 is the glass substrate, the illumination may be arranged in a region where the substrate 20 is to be mounted in the upper surface 112a of the substrate stage 112. If the substrate 20 is the semiconductor substrate, for example, the illumination may be arranged at the periphery of the region where the substrate 20 is to be mounted in the upper surface 112a of the substrate stage 112.

Alternatively, the recognition mechanism 150 may include an IR illumination 154 illustrated with a chain dashed line in FIG. 2A in place of the ring illumination 153. In this case, the camera 152 may be an IR camera. Thus, the recognition mechanism 150 can illuminate a subject (e.g., semiconductor chip 11 and substrate 20) with an IR light (infrared light) exit from the IR illumination 154, and receive a transmissive light (IR light) thereof with the camera 152 through the lens barrel 151.

Alternatively, although not illustrated, the recognition mechanism 150 may include an upper and lower simultaneous recognition camera in place of the camera 152. The upper and lower simultaneous recognition camera is inserted to a space between the plurality of semiconductor chips 11-1 to 11-6 and the substrate 20 to be able to simultaneously image the semiconductor chip 11 and the substrate 20. Thus, the recognition mechanism 150 can simultaneously recognize the respective positions of the semiconductor chip 11 and the substrate 20.

In the bonding method of the semiconductor chip, steps illustrated in FIGS. 3A to 3C, FIGS. 4A to 4C, and FIGS. 5A to 5C are carried out as the temporary bonding in the plasma activated bonding.

Figure 3A:
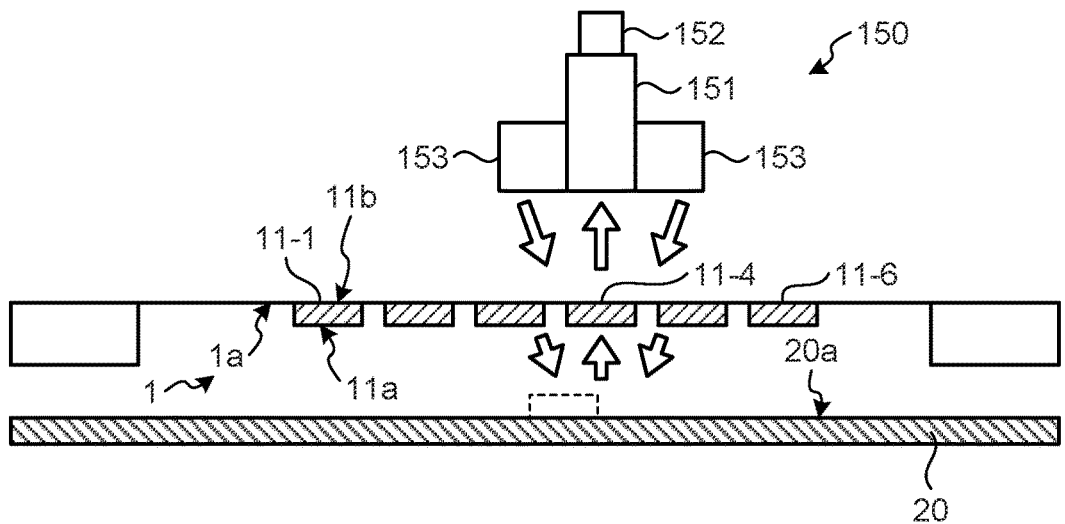
FIGS. 3A to 3C are cross-sectional views illustrating a bonding method of the semiconductor chip according to the embodiment.

In the step illustrated in FIG. 3A, the arrangement mechanism 110 arranges the activated front surfaces 11a of the plurality of semiconductor chips 11-1 to 11-6 and the activated front surface 20a of the substrate 20 so as to face each other. The back surfaces 11b of the plurality of semiconductor chips 11-1 to 11-6 are attached to the front surface 1a of the adhesive sheet 1.

Figure 6A:
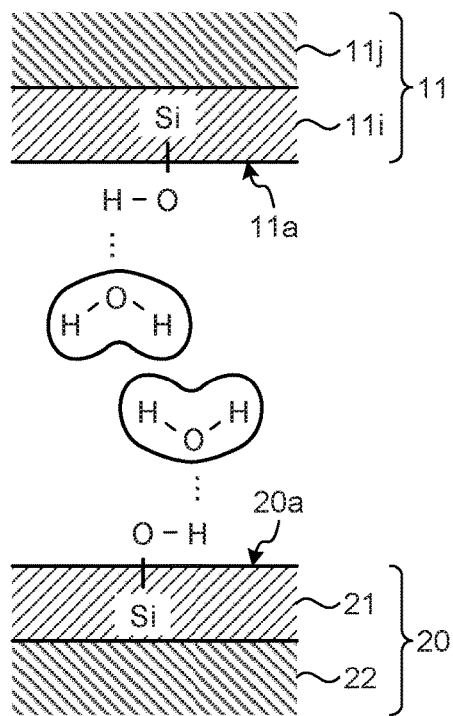
FIGS. 6A to 6D are explanatory views illustrating a mechanism of plasma activated bonding according to the embodiment.

At this time, the activated front surface 11a of the semiconductor chip 11 and the activated front surface 20a of the substrate 20 are respectively terminated with the hydroxyl group, but the water molecule (H—O—H) is often bonded to the hydroxyl group (—O—H) through hydrogen bonding, as illustrated in FIG. 6A. FIGS. 6A to 6D are views illustrating a mechanism of the plasma activated bonding. In FIGS. 6A to 6D, a case in which the vicinity of the front surface 11a is a silicon dioxide film 11i in the semiconductor chip 11 and a silicon region 11j is arranged at a position deeper than the silicon dioxide film 11i, and the vicinity of the front surface 20a is a silicon dioxide film 21 in the substrate 20 and a silicon region 22 is arranged at a position deeper than the silicon dioxide film 21 is illustrated.

As illustrated in FIG. 3A, the recognition mechanism 150 recognizes the position in the substrate 20 where the semiconductor chip 11 is to be mounted. For example, the recognition mechanism 150 illuminates the substrate 20 with the ring illumination 153, and receives the reflected light with the camera 152 through the lens barrel 151. Thus, the recognition mechanism 150 can image the substrate 20, and recognize the position indicated with a broken line in FIG. 3A as the position in the substrate 20 where the semiconductor chip 11-4 is to be mounted. The recognition mechanism 150 provides the recognition result to the controller 170.

Figure 3B:
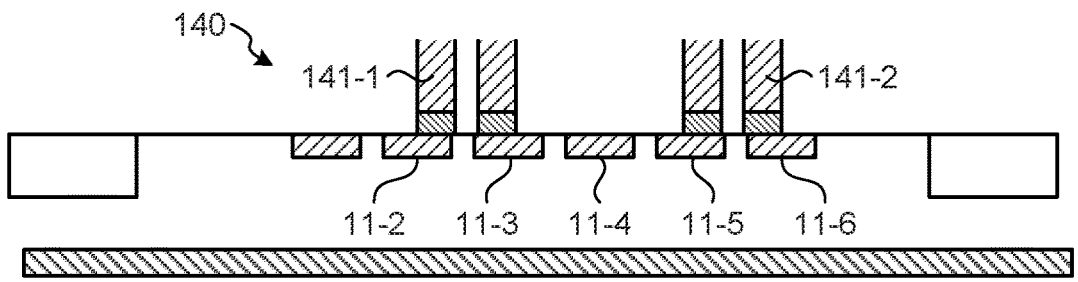

In the step illustrated in FIG. 3B, the holding mechanism 140 holds the region at the periphery of the region to be pushed by the pushing mechanism 130 in the adhesive sheet 1. For example, the controller 170 can cause the suctioning structures 141b-1, 141b-2 to be in a vacuum-suctionable state, and controls the head drive units 142-1, 142-2 to move the holding heads 141-1, 141-2 in the −Z direction (see FIG. 2A). If the semiconductor chip 11-4 is selected as the semiconductor chip to be pushed among the plurality of semiconductor chips 11-1 to 11-6, the region at the periphery of the region corresponding to the semiconductor chip 11-4 in the adhesive sheet 1 is vacuum-suctioned by the holding mechanism 140. In FIG. 3B, a case of vacuum-suctioning the regions corresponding to the semiconductor chips 11-2, 11-3, 11-5, 11-6 in the adhesive sheet 1 with the holding heads 141-1, 141-2 is illustrated, but the region is not limited to the regions corresponding to the semiconductor chips 11-2, 11-3, 11-5, 11-6 as long as it is at the periphery of the region corresponding to the semiconductor chip 11-4. Thus, the deflection of the region to be pushed by the pushing mechanism 130 in the adhesive sheet 1 can be controlled.

Figure 3C:
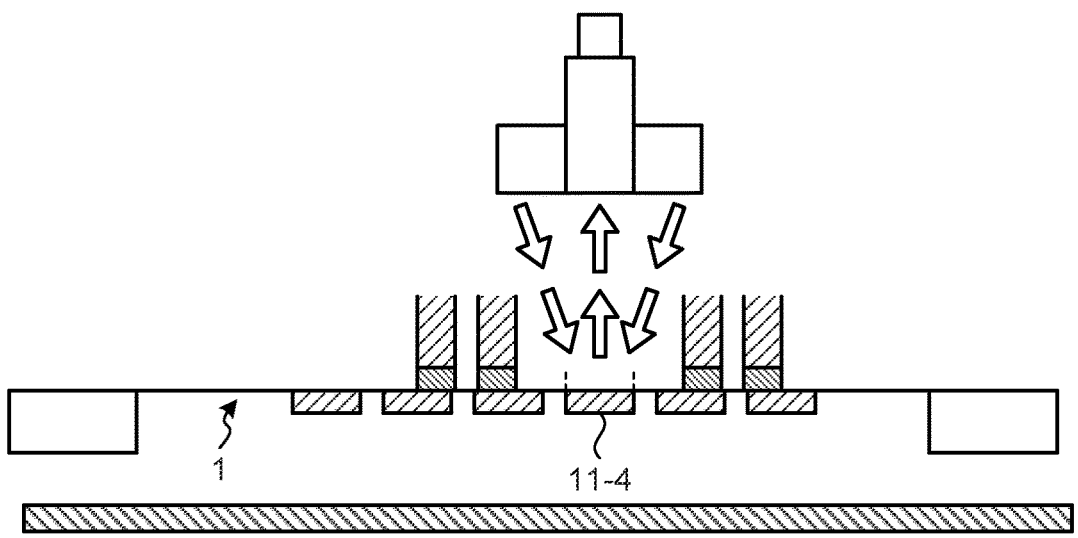

In the step illustrated in FIG. 3C, the recognition mechanism 150 recognizes the position to be pushed by the pushing mechanism 130 in the adhesive sheet 1. For example, the recognition mechanism 150 illuminates the adhesive sheet 1 and the semiconductor chip 11-4 with the ring illumination 153, and receives the reflected light with the camera 152 through the lens barrel 151. Thus, the recognition mechanism 150 can image the adhesive sheet 1 and the semiconductor chip 11-4, and recognize the position indicated with a broken line in FIG. 3C as the position to be pushed by the pushing mechanism 130 in the adhesive sheet 1. The recognition mechanism 150 provides the recognition result to the controller 170.

It should be noted that, the position (absolute position or the relative position with respect to the substrate 20) of the adhesive sheet 1 and the semiconductor chop 11-4 has a possibility of shifting when the holding mechanism 140 vacuum-suctions the adhesive sheet 1 in the step illustrated in FIG. 3B, but the recognized position is less likely to be subjected to the influence of shift since the position of after the shift can be recognized in the step illustrated in FIG. 3C.

Figure 4A:
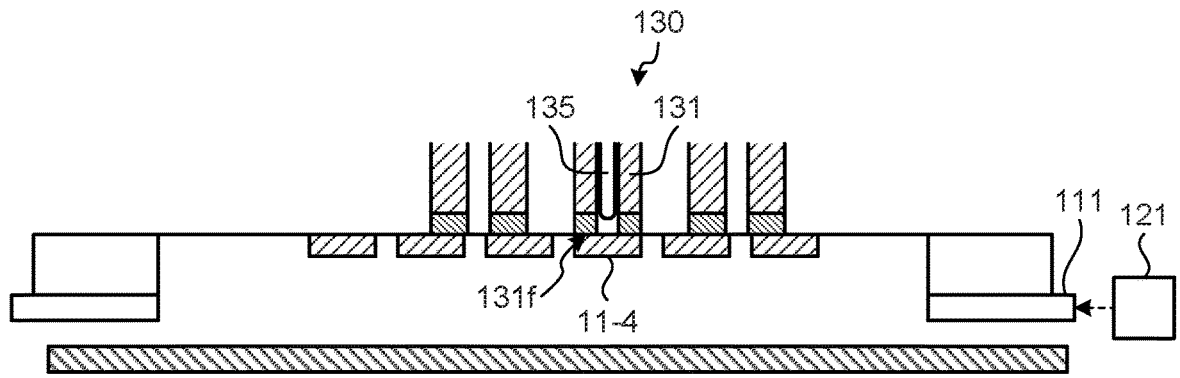
FIGS. 4A to 4C are cross-sectional views illustrating the bonding method of the semiconductor chip according to the embodiment.

In the step illustrated in FIG. 4A, the pushing mechanism 130 vacuum-suctions the adhesive sheet 1. For example, the controller 170 obtains the drive amount of the sheet stage 111 for positioning the position to be pushed by the pushing mechanism 130 in the adhesive sheet 1 to under the pushing mechanism 130 and provides the same to the drive mechanism 121 of the alignment mechanism 120 according to the recognition result by the recognition mechanism 150. The drive mechanism 121 drives the sheet stage 111 according to the command of the drive amount. The position to be pushed by the pushing mechanism 130 in the adhesive sheet 1 is thereby positioned under the pushing mechanism 130. The controller 170 causes the suctioning structure 131b to be in a vacuum-suctioning state, and controls the head drive unit 132 to move the pushing head 131 in the −Z direction (see FIG. 2A). Thus, the adhesive sheet 1 is vacuum-suctioned to the pushing surface 131f of the pushing head 131. In this case, the pin 135 is maintained in a state retracted toward the pushing head 131 side from the pushing surface 131f.

Figure 4B:
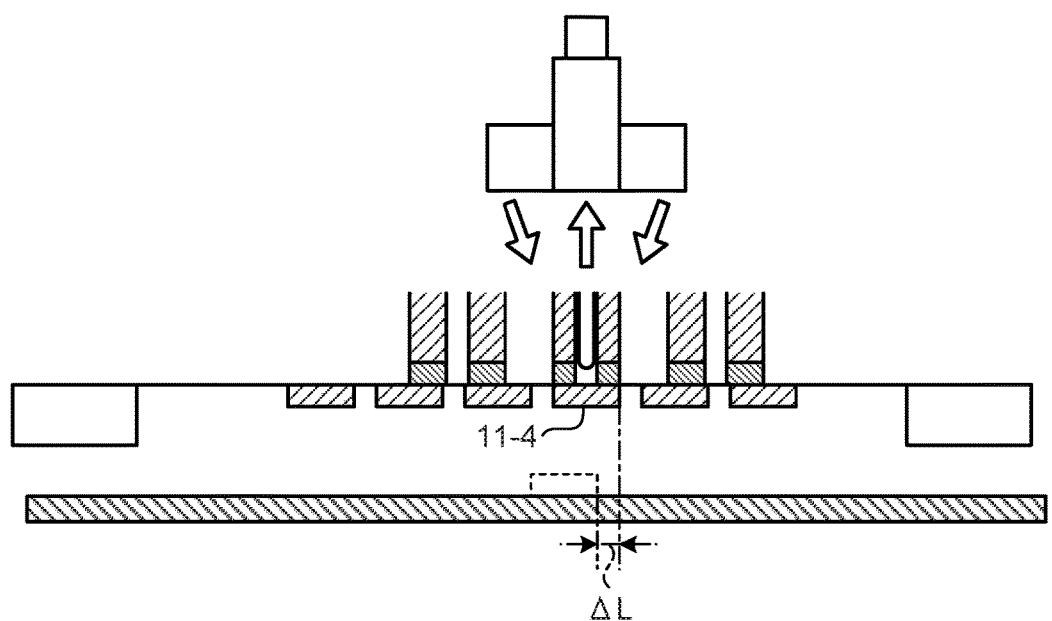

In the step illustrated in FIG. 4B, the recognition mechanism 150 recognizes the position (absolute position or relative position with respect to the substrate 20) of the semiconductor chip 11. For example, the recognition mechanism 150 illuminates the semiconductor chip 11-4 with the ring illumination 153, and receives the reflected light with the camera 152 through the lens barrel 151. The recognition mechanism 150 can image the semiconductor chip 11-4, and recognize the position of the semiconductor chip 11. The recognition mechanism 150 provides the recognition result to the controller 170.

It should be noted that, although the position (absolute position or the relative position with respect to the substrate 20) of the adhesive sheet 1 and the semiconductor chop 11-4 has a possibility of shifting when the pushing mechanism 130 vacuum-suctions the adhesive sheet 1 in the step illustrated in FIG. 4A, the position to be recognized is less likely to be subjected to the influence of shift since the position of after the shift can be recognized in the step illustrated in FIG. 4B.

Figure 4C:
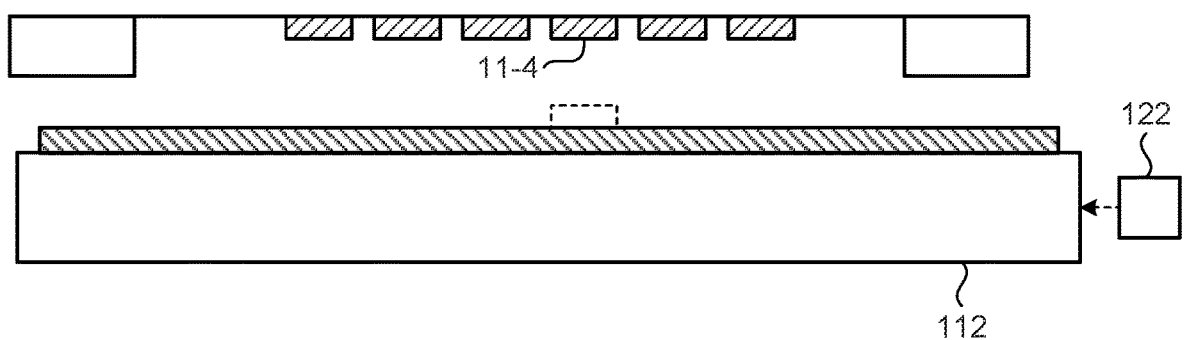

In the step illustrated in FIG. 4C, the alignment mechanism 120 aligns the relative positions of the semiconductor chip 11 and the substrate 20. For example, the controller 170 obtains the drive amount for alignment based on the recognition result received in the step illustrated in FIG. 3A and the recognition result received in the step illustrated in FIG. 4B. For example, the controller 170 obtains a difference ΔL (see FIG. 4B) of the position in the substrate 20 where the semiconductor chip 11-4 is to be mounted and the position of the semiconductor chip 11-4 for each of the X direction, the Y direction, and the θ direction. The controller 170 obtains the drive amount of each of the X direction, the Y direction, and the θ direction so as to cancel the difference ΔL, and provides the same to the drive mechanism 122 of the alignment mechanism 120. The drive mechanism 122 drives the substrate stage 112 according to the command of the drive amount. Thus, the position of the semiconductor chip 11-4 and the position in the substrate 20 where the semiconductor chip 11-4 is to be mounted are relatively aligned.

In the step illustrated in FIG. 5A, the pushing mechanism 130 pushes the back surface 11b of the semiconductor chip 11 through the adhesive sheet 11. For example, the controller 170 controls the head drive unit 132 to move the pushing head 131 further in the −Z direction (see FIG. 2A). Thus, the pushing head 131 pushes the back surface 11b of the semiconductor chip 11-4 through the adhesive sheet 1, and closely attaches the activated front surface 11a of the semiconductor chip 11-4 to the activated front surface 20a of the substrate 20. The semiconductor chip 11-4 is thereby temporarily bonded to the substrate 20. The adhesive sheet 1 is also elastically deformed thus generating a tensile force between the region pushed with the pushing mechanism 130 and the region held with the holding mechanism 140 (holding heads 141-1, 141-2).

Figure 6B:
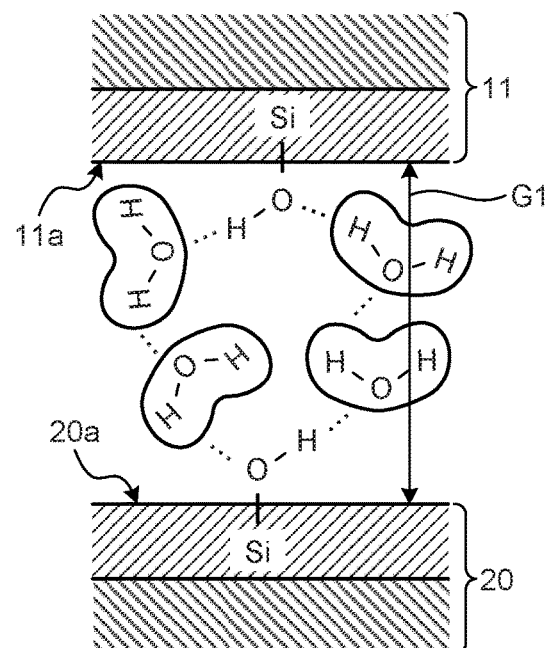

At this time, as illustrated in FIG. 6B, the activated front surface 11a of the semiconductor chip 11 and the activated front surface 20a of the substrate 20 are temporarily bonded as the water molecules (H—O—H) bonded to the hydroxyl group are bonded to each other by hydrogen bonding.

Figure 5B:
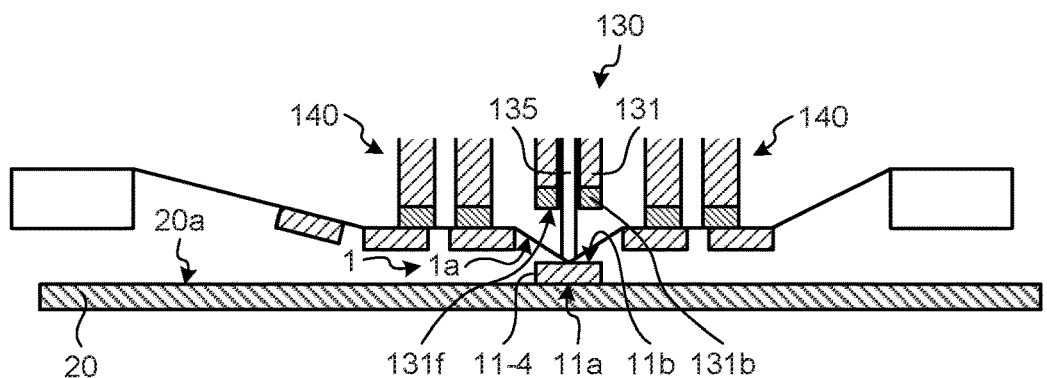

In the step illustrated in FIG. 5B, the pushing mechanism 130 strips the adhesive sheet 1 from the back surface 11b of the semiconductor chip 11 while maintaining the state in which the activated front surface 11a of the semiconductor chip 11 is closely attached to the activated front surface 20a of the substrate 20. For example, the controller 170 controls the pin drive unit 136 to enable the pin 135 to push the back surface 11b of the semiconductor chip 11 through the adhesive sheet 1. The controller 170 controls the depressurization mechanism 160 to release the vacuum adsorption of the suctioning structure 131b. The controller 170 controls the head drive unit 132 to move the pushing head 131 in the +Z direction while controlling the pin drive unit 136 to maintain the state in which the pin 135 pushes the back surface 11b of the semiconductor chip 11 through the adhesive sheet 1 (see FIG. 2A). In other words, as the pushing head 131 moves in the +Z direction away from the back surface 11b of the semiconductor chip 11, the pin 135 projects out from the pushing surface 131f while maintaining the state of pushing the back surface 11b of the semiconductor chip 11 through the adhesive sheet 1.

At this time, the adhesion force of the adhesive formed on the front surface 1a of the adhesive sheet 1 is lowered in the step illustrated in FIG. 5B. Thus, the adhesive sheet 1 is easily stripped from the periphery of the region pushed with the pin 135 in the back surface 11b of the semiconductor chip 11-4 by the tensile force between the region pushed with the pushing mechanism 130 in the adhesive sheet 1 and the region held by the holding mechanism 140.

Figure 5C:
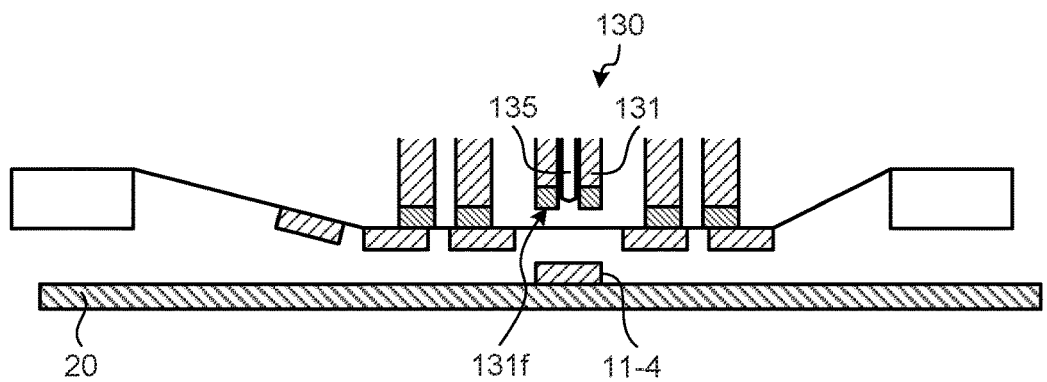

In the step illustrated in FIG. 5C, the pushing mechanism 130 completes the stripping of the adhesive sheet 1 from the back surface 11b of the semiconductor chip 11. For example, the controller 170 controls the pin drive unit 136 to move the pin 135 in the +Z direction, and releases the state of pushing the back surface 11b of the semiconductor chip 11 through the adhesive sheet 1. The controller 170 may control the pin drive unit 136 to have the pin 135 in the state retracted toward the pushing head 131 side than the pushing surface 131f.

Consider a case of releasing the pushing by the pushing head 131 to release, all at once, the pushing against the back surface 11b of the semiconductor chip 11 without having the pin 135 push the back surface 11b of the semiconductor chip 11 through the adhesive sheet 1. In this case, substantially the entire surface of the back surface 11b of the semiconductor chip 11-4 is adhered to the adhesive sheet 1, and the area of the region adhered to the adhesive sheet 1 in the back surface 11b of the semiconductor chip 11-4 is large. Thus, the force of pulling the semiconductor chip 11-4 upward with the tensile force and the adhesive force of the adhesive sheet 1 may become greater than the force of pulling the semiconductor chip 11-4 downward with the force of the temporary bonding of the semiconductor chip 11-4 to the substrate 20. Thus, the state in which the semiconductor chip 11-4 is temporarily bonded to the substrate 20 may not be maintained and the semiconductor chip 11-4 may be stripped from the substrate 20.

On the contrary, in the present embodiment, the area of the region adhered to the adhesive sheet 1 in the back surface 11b of the semiconductor chip 11-4 is small in the step illustrated in FIG. 5C. Thus, the force of pulling the semiconductor chip 11-4 downward with the force of the temporarily bonding of the semiconductor chip 11-4 to the substrate 20 can easily overcome the force of pulling the semiconductor chip 11-4 upward with the tensile force and the adhesive force of the adhesive sheet 1. The stripping of the adhesive sheet 1 from the back surface 11b of the semiconductor chip 11 thus can be completed while maintaining the state in which the semiconductor chip 11-4 is temporarily bonded to the substrate 20.

Similarly, other semiconductor chips 11-1 to 11-3, 11-5, 11-6 attached to the adhesive sheet 1 can be temporarily bonded to the substrate 20 by carrying out the steps of FIGS. 3A to 3C, FIGS. 4A to 4C, and FIGS. 5A to 5C.

Figure 5D:
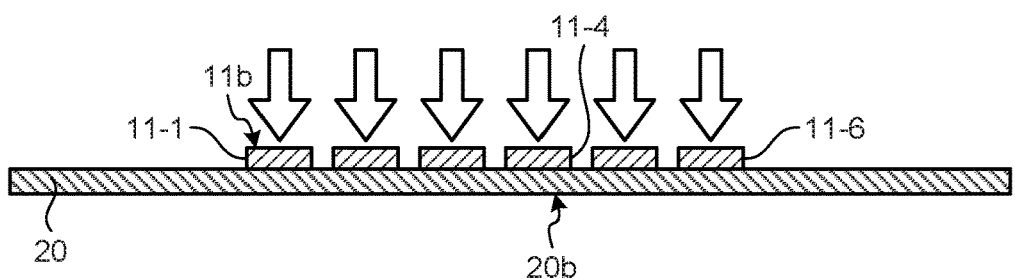

In the bonding method of the semiconductor chip, the step illustrated in FIG. 5D is then carried out as the actual bonding in the plasma activated bonding.

In the step illustrated in FIG. 5D, the semiconductor chip 11 is heated with the back surface 11b of the semiconductor chip 11 physically pressurized. For example, the back surface 11b of the semiconductor chip 11 is thermally brought into contact with the hot plate through a buffer sheet (made from a heat resisting material), and heated at lower than or equal to 250° C., for example. At the same time, the substrate 20 may be brought into contact with a different hot plate from the back surface 20b side and heated at lower than or equal to 250° C. The heating temperature is desirably appropriately (e.g., suitably) set according to the material and the structure of the semiconductor chip and the substrate, and for example, can be higher than or equal to 1000° C. if between materials having the same coefficient of thermal expansion, for example, so that the time for the bonding process to be described later can be reduced and the productivity can be enhanced. In the bonding between materials having different coefficients of thermal expansion such as the silicon and the III-V group semiconductor, the residual heat stress due to the lowering of the temperature after the bonding process is terminated reduces, and hence the temperature is recommended to be as low as possible, and desirably, lower than or equal to 150° C.

Figure 6C:
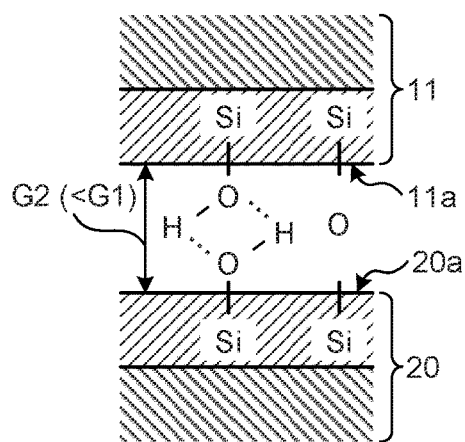
Figure 6D:
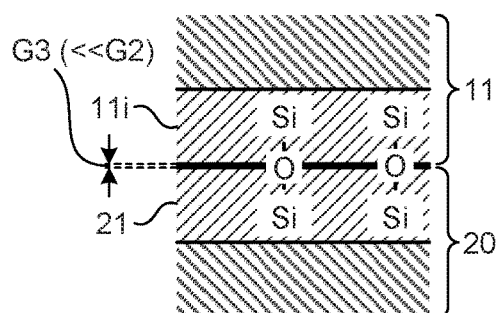

In the process of pressurization and heating described above, at the bonding interface of the semiconductor chip 11 and the substrate 20, the water molecules (H—O—H) pass from the bonding interface, and the hydrogen bonding of the water molecules (H—O—H) change to the hydrogen bonding of the hydroxyl groups (—O—H) or change to the covalent bonding through an oxygen atom (—O—), as illustrated in FIG. 6C. The bonding interface width of the front surface 11a of the semiconductor chip 11 and the front surface 20a of the substrate 20 is thus narrowed from G1 to G2 (<G1). As the bonding process advances, at the bonding interface of the semiconductor chip 11 and the substrate 20, the water molecules (H—O—H) pass from the hydrogen bonding of the hydroxyl groups (—O—H) thus changing to the covalent bonding through the oxygen atom (—O—), as illustrated in FIG. 6D. The bonding interface width of the front surface 11a of the semiconductor chip 11 and the front surface 20a of the substrate 20 is thus narrowed from G2 to G3 (<<G2), and the oxide films 11i, 21 of the front surfaces are actually bonded in a substantially integrated manner.

It should be noted that the actual bonding can be performed without physical pressure depending on the material of the substrate and the material of the semiconductor chip. In this case, in the step illustrated in FIG. 5D, the semiconductor chip 11 can be heated without physically pressuring the back surface 11b of the semiconductor chip 11. For example, if the semiconductor chip is formed of In—P material system, the actual bonding can be performed with heating at about 200° C. without physical pressure. In this way, whether or not physical pressure is necessary in the actual bonding steps changes depending on various conditions such as materials or chip sizes.

As described above, in the embodiment, the front surface 11a of the semiconductor chip 11 and the front surface 20a of the substrate 20 are respectively activated by plasma thus closely attaching the semiconductor chip 11 to the substrate 20 in the boding method of the semiconductor chip. Thus, the semiconductor chip 11 can be temporarily bonded on the substrate 20 at a normal temperature without interposing the solder bump, whereby the semiconductor chip 11 can be mounted on the substrate 20 while suppressing the thermal deformation of the semiconductor chip 11. As a result, the alignment accuracy of the bonding of the semiconductor chip at the time of temporary bonding can be easily enhanced. Although the semiconductor chip 11 is subsequently heated and pressurized to be actually bonded to the substrate 20, the alignment accuracy of the bonding of the semiconductor chip in the actual bonding can be easily enhanced since the bonding position of the semiconductor chip 11 on the substrate 20 can be substantially fixed with the temporary bonding.

In the embodiment, the semiconductor chip 11 can be bonded onto the substrate 20 without interposing the solder bump in the bonding method of the semiconductor chip, and hence the arrangement density of the pad electrodes in the semiconductor chip 11 can be easily enhanced. For example, the arrangement pitch of the pad electrodes in the semiconductor chip may be about a few μm. The mounting density of the semiconductor chip 11 thus can be easily enhanced.

Furthermore, in the embodiment, the activated front surface 11a of the semiconductor chip 11 attached to the adhesive sheet 1 and the activated front surface 20a of the substrate 20 are arranged to face each other, and the back surface 11b of the semiconductor chip 11 is pushed through the adhesive sheet 1 to temporarily bond the semiconductor chip 11 to the substrate 20 in the bonding method of the semiconductor chip. The adhesive sheet 1 is stripped from the back surface 11b of the semiconductor chip 11 while maintaining the state in which the activated front surface 11a of the semiconductor chip 11 is closely attached to the activated front surface 20a of the substrate 20. Thus, the semiconductor chip 11 can be handled without touching the activated front surface 11a of the semiconductor chip 11 when temporarily bonding the semiconductor chip 11 to the substrate 20, and the temporary bonding can be completed while suppressing the production of particles.

In the embodiment, the activated front surfaces 11a of the plurality of semiconductor chips 11 and the activated front surface 20a of the substrate 20 are arranged to face each other with the back surfaces 11b of the plurality of semiconductor chips 11 attached to the adhesive sheet 1 in the bonding method of the semiconductor chip. The process of pushing the back surface 11b of the semiconductor chip 11 selected from the plurality of semiconductor chips 11 to closely attach the activated front surface 11a of the semiconductor chip 11 to the activated front surface 20a of the substrate 20, and stripping the adhesive sheet 1 from the back surface 11b of the semiconductor chip 11 while maintaining the closely attached state is sequentially carried out for each semiconductor chip 11. Thus, the temporary bonding of the plurality of semiconductor chips 11 to the substrate 20 can be efficiently carried out while suppressing the production of particles.

Moreover, in the embodiment, the interval of the plurality of semiconductor chips 11 on the adhesive sheet 1 is widened before arranging the activated front surfaces 11a of the plurality of semiconductor chips 11 and the activated front surface 20a of the substrate 20 so as to face each other in the bonding method of the semiconductor chip. For example, the interval of the plurality of semiconductor chips 11 on the adhesive sheet 1 is made wider than the thickness of the semiconductor chip 11. Thus, the side surface 11c of the semiconductor chip 11 to be pushed is less likely to make contact with the side surface 11c of the adjacent semiconductor chip 11 and the production of particles can be suppressed in the step of pushing the semiconductor chip 11 through the adhesive sheet 1.

In the embodiment, the step of pushing the back surface 11b of the semiconductor chip 11 through the adhesive sheet 1 is carried out with the region at the periphery of the region to be pushed in the adhesive sheet 1 held by the holding mechanism 140 in the bonding method of the semiconductor chip. Thus, the back surface 11b of the semiconductor chip 11 can be pushed through the adhesive sheet 1 with the deflection of the adhesive sheet 1 appropriately controlled, so that the stripping of the adhesive sheet 1 from the back surface 11b of the semiconductor chip 11 can be subsequently carried appropriately.

In the embodiment, the pushing mechanism 130 pushes the back surface 11b of the semiconductor chip 11 through the adhesive sheet 1 to closely attach the activated front surface 11a of the semiconductor chip 11 to the activated front surface 20a of the substrate 20 in the bonding apparatus of the semiconductor chip. The pushing mechanism 130 also strips the adhesive sheet 1 from the back surface 11b of the semiconductor chip 11 while maintaining the state in which the activated front surface 11a of the semiconductor chip 11 is closely attached to the activated front surface 20a of the substrate 20. Thus, the semiconductor chip 11 can be handled without touching the activated front surface 11a of the semiconductor chip 11 when temporarily bonding the semiconductor chip 11 to the substrate 20, and the temporary bonding can be carried out while suppressing the production of particles.

In the embodiment, the pushing head 131 includes the pushing surface 131f in correspondence with the back surface 11b of the semiconductor chip 11 in the pushing mechanism 130 of the bonding apparatus of the semiconductor chip. The back surface 11b of the semiconductor chip 11 thus can be pushed at a substantially uniform force within the plane.

In the embodiment, the pin 135 can be changed between the state of being retracted toward the pushing head 131 side than the pushing surface 131f and the state of being projected out from the pushing surface 131f in the pushing mechanism 130 of the bonding apparatus of the semiconductor chip. Thus, the pin 135 is retracted toward the pushing head 131 side than the pushing surface 131f when the pushing head 131 pushes the back surface 11b of the semiconductor chip 11 through the adhesive sheet 1, so that the pin 135 does not become a hindrance in the pushing operation of the pushing head 131. The pin 135 is projected out from the pushing surface 131f when the pushing by the pushing head 131 is released, so that the stripping of the adhesive sheet 1 from the back surface 11b of the semiconductor chip 11 can be easily completed while maintaining the state in which the semiconductor chip 11-4 is temporarily bonded to the substrate 20.

In the embodiment, the pushing mechanism 130 pushes the back surface 11b of the semiconductor chip 11 through the adhesive sheet 1 toward the substrate 20 side with the region at the periphery of the region to be pushed by the pushing mechanism 130 in the adhesive sheet 1 held by the holding mechanism 140 in the bonding apparatus of the semiconductor chip. Thus, the back surface 11b of the semiconductor chip 11 can be pushed through the adhesive sheet 1 with the deflection of the adhesive sheet 1 appropriately controlled, so that the stripping of the adhesive sheet 1 from the back surface 11b of the semiconductor chip 11 can be subsequently carried appropriately.

In the embodiment, the alignment mechanism 120 positions the region to be pushed with the pushing mechanism 130 in the adhesive sheet 1 based on the recognition result of the recognition mechanism 150 in the bonding apparatus of the semiconductor chip. The alignment mechanism 120 aligns the relative positions of the semiconductor chip 11 and the substrate 20 based on the recognition result of the recognition mechanism 150. The pushing mechanism 130 pushes the back surface 11b of the semiconductor chip 11 through the adhesive sheet 1 with the relative positions of the semiconductor chip 11 and the substrate 20 aligned. Thus, the pushing mechanism 130 can accurately push, and each of the plurality of semiconductor chips 11 attached to the adhesive sheet 1 can be mounted on appropriate positions on the substrate 20.

It should be noted that, in the step illustrated in FIG. 1C, for example, the interval of the adjacent semiconductor chips 11-1 to 11-6 can be widened by decimating the plurality of semiconductor chips 11-1 to 11-6. For example, the interval of the adjacent semiconductor chips 11-1 to 11-6 can be widened to an extent corresponding to one chip width by decimating the semiconductor chips 11-2, 11-4, 11-6 from the plurality of semiconductor chips 11-1 to 11-6. However, particles may produce when decimating the semiconductor chips 11-2, 11-4, 11-6. Therefore, after the decimation, the washing (e.g., ultrasonic washing) and the drying processes are sequentially carried out with respect to the front surface 11a of each semiconductor chip 11 with each semiconductor chip 11 attached to the adhesive sheet 11. The particles attached to the front surface 11a of each semiconductor chip 11 are thereby removed.

The timing to carry out the step (step illustrated in FIG. 1D) of widening the interval of the plurality of semiconductor chips 11-1 to 11-6 merely needs to be before the step (step illustrated in FIG. 3A) of arranging the semiconductor chip 11 and the substrate 20 to face each other, and is not limited to after the step illustrated in FIG. 1B. For example, the timing to carry out the step (step illustrated in FIG. 1D) of widening the interval of the plurality of semiconductor chips 11-1 to 11-6 may be after the step illustrated in FIG. 1D and before the step illustrated in FIG. 3A.

In the bonding method of the semiconductor chip, the steps illustrated in FIGS. 7A to 7D may be carried out in place of the steps illustrated in FIGS. 1A and 1B.

Figure 7A:
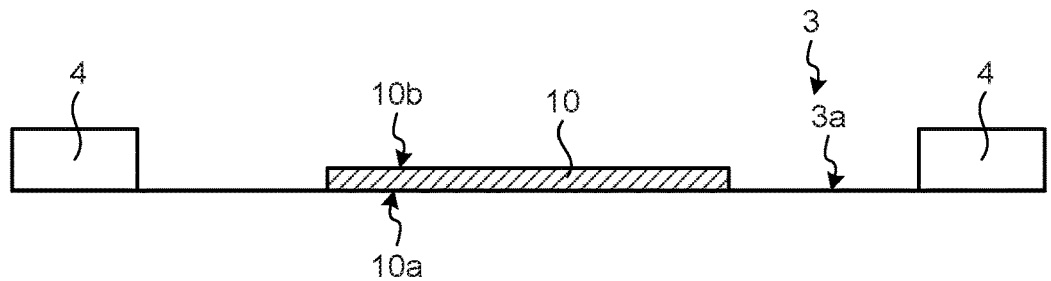
FIGS. 7A to 7D are cross-sectional views illustrating a bonding method of a semiconductor chip according to a variant of the embodiment.

In the step illustrated in FIG. 7A, the semiconductor substrate 10 similar to that prepared in the step illustrated in FIG. 1A is prepared. The front surface 10a of the prepared semiconductor substrate 10 is attached to a front surface 3a of an adhesive sheet (dicing tape) 3. In other words, the semiconductor substrate 10 is attached to the adhesive sheet 3 with the back surface 10b exposed (face-down state). The adhesive sheet 3 has an adhesive applied on the front surface 3a. The adhesive may be, for example, an adhesive having UV curability. The adhesive sheet 3 is stretched within a frame of an annular flat ring 4 and fixed to the flat ring 4. The adhesive sheet 3 is, for example, made from a transparent resin having light permeability.

Figure 7B:
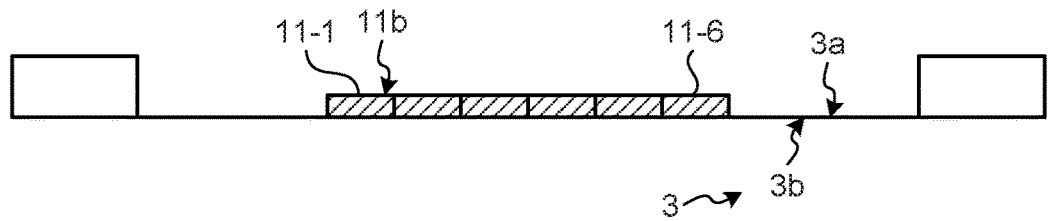

In the step illustrated in FIG. 7B, the semiconductor substrate 10 is divided and singulated to a plurality of semiconductor chips 11-1 to 11-6. For example, the semiconductor substrate 10 is dicing processed along the dicing line. The dicing process may be carried out by cutting with the dicing blade along the dicing line. Alternatively, the dicing process may be carried out by emitting laser along the dicing line to perform laser processing.

Since the semiconductor substrate 10 is attached to the adhesive sheet 3 with the back surface 10b exposed (face-down state), the particles can be prevented from attaching to the front surface 11a of the semiconductor chip 11.

Thereafter, the UV irradiation is carried out on the adhesive sheet 3 from the back surface 3b side to cure the adhesive applied on the front surface 3a of the adhesive sheet 3 thus lowering the adhesion force thereof.

The washing (e.g., ultrasonic washing) and the drying processes may be sequentially carried out with respect to the back surface 11b of each semiconductor chip 11 with each semiconductor chip 11 attached to the adhesive sheet 3. Thus, if the particles are attached to the back surface 11b of each semiconductor chip 11, the attached particles can be removed.

Figure 7C:
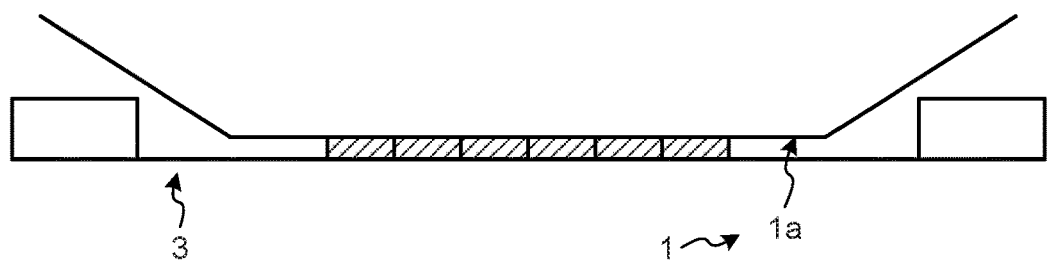

In the step illustrated in FIG. 7C, the front surface 1a of the adhesive sheet 1 is attached to the back surfaces 11b of the plurality of singulated semiconductor chips 11-1 to 11-6. In this case, the adhesion force of the adhesive formed on the front surface 3a of the adhesive 3 is lowered in the step illustrated in FIG. 7B. Thus, the plurality of semiconductor chips 11-1 to 11-6 are easily transferred from the adhesive sheet 3 to the adhesive sheet 1. In other words, the semiconductor substrate 10 is attached to the adhesive sheet 1 with the front surface 10a exposed (face-up state).

Figure 7D:
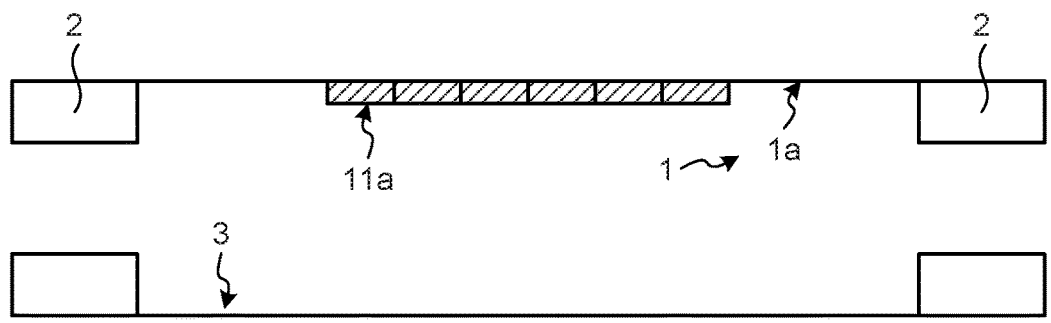

In the step illustrated in FIG. 7D, the adhesive sheet 1, to which the plurality of semiconductor chips 11-1 to 11-6 are transferred, is stretched within the frame of the annular flat ring 2 and fixed to the flat ring 2.

Thereafter, the step illustrated in FIG. 1C and the subsequent steps are carried out.

The dicing process of the semiconductor substrate 10 is carried out with the semiconductor substrate 10 faced down, so that the attachment of the particles produced at the time of the dicing process to the front surface 11a of each singulated semiconductor chip 11 can be further reduced, and the particles can be effectively suppressed from interposing at the bonding interface at the time of the temporary bonding of the semiconductor chip 11 to the substrate 20.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

(Additional Note 1)

A bonding method of a semiconductor chip comprising:

arranging an activated front surface of a semiconductor chip and an activated front surface of a substrate so as to face each other with a back surface of the semiconductor chip attached to a sheet;

pushing the back surface of the semiconductor chip through the sheet to closely attach the activated front surface of the semiconductor chip and the activated front surface of the substrate; and stripping the sheet from the back surface of the semiconductor chip while maintaining the state in which the activated front surface of the semiconductor chip is closely attached to the activated front surface of the substrate.

(Additional Note 2)

The bonding method of the semiconductor chip according to additional note 1, further comprising irradiating the front surface of the semiconductor chip with a plasma or an energy beam with the back surface of the semiconductor chip attached to the sheet to activate the front surface before the arranging step.

(Additional Note 3)

The bonding method of the semiconductor chip according to additional note 1, further comprising heating the semiconductor chip with the back surface of the semiconductor chip pressurized after the stripping.

(Additional Note 4)

The bonding method of the semiconductor chip according to additional note 1, wherein a vicinity of the front surface of the semiconductor chip is made of a material having any one of a silicon, a silicon oxide, a III-V group semiconductor, or an oxide of the III-V group semiconductor as a main component.

(Additional Note 5)

The bonding method of the semiconductor chip according to additional note 1, wherein the substrate includes a semiconductor substrate or a glass substrate.

(Additional Note 6)

The bonding method of the semiconductor chip according to additional note 5, wherein a vicinity of the front surface of the semiconductor substrate is made of a material having a silicon or a silicon oxide as a main component.

(Additional Note 7)

The bonding method of the semiconductor chip according to additional note 1, wherein the front surface of the semiconductor chip has planarity of smaller than or equal to 1 nm.

(Additional Note 8)

The bonding method of the semiconductor chip according to additional note 1, wherein the front surface of the substrate has planarity of smaller than or equal to 1 nm.

(Additional Note 9)

The bonding method of the semiconductor chip according to additional note 1, wherein the arranging includes arranging activated front surfaces of a plurality of semiconductor chips and the activated front surface of the substrate so as to face each other with back surfaces of the plurality of semiconductor chips attached to the sheet, the closely attaching includes pushing the back surface of the semiconductor chip selected from the plurality of semiconductor chips through the sheet to closely attach the activated front surface of the selected semiconductor chip and the activated front surface of the substrate, and the stripping includes stripping the sheet from the back surface of the selected semiconductor chip.

(Additional Note 10)

The bonding method of the semiconductor chip according to additional note 9, further comprising widening an interval of the plurality of semiconductor chips before the arranging.

(Additional Note 11)

The bonding method of the semiconductor chip according to additional note 10, wherein the widening includes widening the interval of the plurality of semiconductor chips to greater than a thickness of the semiconductor chip.

(Additional Note 12)

The bonding method of the semiconductor chip according to additional note 9, wherein the closely attaching includes pushing the back surface of the selected semiconductor chip through the sheet while holding a region at a periphery of the selected semiconductor chip in the sheet.

(Additional Note 13)

The bonding method of the semiconductor chip according to additional note 12, wherein the holding includes suctioning and holding the region at the periphery of the selected semiconductor chip in the sheet.

(Additional Note 14)

The bonding method of the semiconductor chip according to additional note 9, further comprising:

attaching a front surface of a second semiconductor substrate to a second sheet;

dividing the second semiconductor substrate to singulate to the plurality of semiconductor chips; and attaching the back surfaces of the singulated plurality of semiconductor chips to the sheet, and transferring the plurality of semiconductor chips from the second sheet to the sheet.

(Additional Note 15)

A bonding apparatus of a semiconductor chip comprising:

an arrangement mechanism configured to arrange an activated front surface of a semiconductor chip and an activated front surface of a substrate so as to face each other with a back surface of the semiconductor chip attached to a sheet; and a pushing mechanism configured to push the back surface of the semiconductor chip through the sheet to closely attach the activated front surface of the semiconductor chip to the activated front surface of the substrate, and strip the sheet from the back surface of the semiconductor chip while maintaining the state in which the activated front surface of the semiconductor chip is closely attached to the activated front surface of the substrate.

(Additional Note 16)

The bonding apparatus of the semiconductor chip according to additional note 15, wherein the pushing mechanism includes, a pushing head including a pushing surface corresponding to the back surface of the semiconductor chip, and a pin configured to be changed between a state retracted toward the pushing head side than the pushing surface and a state projected out from the pushing surface.

(Additional Note 17)

The bonding apparatus of the semiconductor chip according to additional note 16, wherein the pushing head includes a buffer member on the pushing surface.

(Additional Note 18)

The bonding apparatus of the semiconductor chip according to additional note 16, wherein the pushing head has an suctioning structure of suctioning the sheet.

(Additional Note 19)

The bonding apparatus of the semiconductor chip according to additional note 15, further comprising a holding mechanism arranged at a periphery of the pushing mechanism, wherein the pushing mechanism pushes the back surface of the semiconductor chip through the sheet toward the substrate side with a region at a periphery of the region to be pushed with the pushing mechanism in the sheet held by the holding mechanism.

(Additional Note 20)

The bonding apparatus of the semiconductor chip according to additional note 15, further comprising:

a recognition mechanism configured to recognize the substrate and the semiconductor chip; and an alignment mechanism configured to align relative positions of the semiconductor chip and the substrate based on a recognition result of the recognition mechanism, wherein the pushing mechanism pushes the back surface of the semiconductor chip through the sheet with the relative positions of the semiconductor chip and the substrate aligned.

What is claimed is:

1. A mounting apparatus for a chip comprising:
an arrangement mechanism comprising a sheet stage and a substrate stage, wherein the sheet stage immovably fixes a sheet where a chip is disposed, the substrate stage is disposed on a first side of the sheet, and the substrate stage holds a substrate;
a pushing mechanism disposed on a second side of the sheet, the second side being opposite to the first side, the pushing mechanism being capable of pushing a first region of the sheet immovably fixed by the sheet stage in a direction of the first side, and the first region being a region corresponding to the chip; and
a holding mechanism disposed on the second side of the sheet, the holding mechanism being disposed at a periphery of the pushing mechanism, the holding mechanism being capable of holding a second region of the sheet immovably fixed by the sheet stage, and the second region being a region at a periphery of the first region when seen in a direction perpendicular to a front surface of the substrate,
wherein the pushing mechanism pushes the first region toward the second side to attach the chip to the substrate in a first period, lowers an adhesion force of the first region to a back surface of the chip in a second period later than the first period, further lowers an adhesion force of the first region to the back surface of the chip in a third period later than the second period, releases an adhesion force of the first region to the back surface of the chip in a fourth period later than the third period, and strips the sheet from the back surface of the chip.

2. The mounting apparatus according to claim 1, wherein:
the arrangement mechanism is configured to arrange a front surface of the chip and the front surface of the substrate such that the front surface of the chip and the front surface of the substrate face each other in a state where the back surface of the chip is attached to the sheet,
the holding mechanism is capable of moving relative to the sheet stage in a direction that is not perpendicular to the front surface of the substrate so as to hold the second region of the sheet, and
the pushing mechanism is configured to push the back surface of the chip through the first region of the sheet so that the front surface of the chip is brought close to the front surface of the substrate.

3. The mounting apparatus according to claim 2, wherein the pushing mechanism is configured to release itself from the first region of the sheet so as to strip the sheet from the back surface of the chip.

4. The mounting apparatus according to claim 2, wherein the pushing mechanism comprises:
a pushing head comprising a pushing surface corresponding to the back surface of the chip, and
a pin configured to retract from the pushing surface and to project from the pushing surface.

5. The mounting apparatus according to claim 4, wherein the pushing head further comprises a buffer member on the pushing surface.

6. The mounting apparatus according to claim 4, wherein the pushing mechanism further comprises a driving unit which causes the pin to retract from the pushing surface and to project from the pushing surface.

7. The mounting apparatus according to claim 1, further comprising:
a recognition mechanism configured to recognize the substrate and the chip; and
an alignment mechanism configured to align relative positions of the chip and the substrate based on a recognition result of the recognition mechanism,
wherein the pushing mechanism pushes the back surface of the chip through the first region of the sheet with the relative positions of the chip and the substrate aligned.

8. The mounting apparatus according to claim 1, wherein the holding mechanism comprises a suctioning structure which suctions the second region of the sheet.

9. The mounting apparatus according to claim 1, wherein the substrate stage and the sheet stage are driven independently from each other.

10. The mounting apparatus according to claim 9, wherein the sheet stage is configured to hold a flat ring which can immovably fix, relative to the sheet stage, the sheet where the chip is attached.

11. The mounting apparatus according to claim 2, wherein the chip is arranged face down above the substrate by the arrangement mechanism.

12. The mounting apparatus according to claim 7, wherein the recognition mechanism comprises an illumination device and a camera.

13. The mounting apparatus according to claim 12, wherein the illumination device is arranged on an opposite side of the pushing mechanism across the substrate stage.

14. The mounting apparatus according to claim 12, wherein the illumination device is an infrared (IR) illumination device.

15. The mounting apparatus according to claim 1, wherein:
the sheet stage is capable of immovably fixing an outer region of the sheet, and
the holding mechanism is capable of holding the second region which is on an inner side of the sheet stage.

16. The mounting apparatus according to claim 1, further comprising:
a controller which controls a drive of the pushing mechanism and a drive of the holding mechanism independently from each other.

17. The mounting apparatus according to claim 16, wherein the controller controls a height of the holding mechanism from the substrate stage to be lower than a height of the pushing mechanism from the substrate stage.

18. The mounting apparatus according to claim 16, wherein the controller controls, after the sheet is held by the holding mechanism, the pushing mechanism to touch the sheet so that the first region is pushed.

19. The mounting apparatus according to claim 1, wherein the pushing mechanism pushes the first region which includes a point position, the point position corresponding to a center of a pushing portion of the pushing mechanism.

20. The mounting apparatus according to claim 1, wherein the mounting apparatus shifts respective positions of the pushing mechanism and the holding mechanism relative to the sheet stage along a plane that intersects a pushing direction of the pushing mechanism, before or after the pushing mechanism pushes the sheet.

* * * * *